(12) United States Patent
Cheng et al.

(10) Patent No.: US 9,496,401 B1
(45) Date of Patent: Nov. 15, 2016

(54) III-V DEVICE STRUCTURE WITH MULTIPLE THRESHOLD VOLTAGE

(71) Applicant: International Business Machines Corporation, Armonk, NY (US)

(72) Inventors: Kangguo Cheng, Schenectady, NY (US); Keith E. Fogel, Hopewell Junction, NY (US); Pouya Hashemi, White Plains, NY (US); Alexander Reznicek, Troy, NY (US)

(73) Assignee: International Business Machines Corpoartion, Armonk, NY (US)

( * ) Notice: Subject to any disclaimer, the term of this patent is extended or adjusted under 35 U.S.C. 154(b) by 0 days.

(21) Appl. No.: 14/755,520

(22) Filed: Jun. 30, 2015

(51) Int. Cl.
| | |
|---|---|
| *H01L 29/775* | (2006.01) |
| *H01L 21/335* | (2006.01) |
| *H01L 29/78* | (2006.01) |
| *H01L 29/205* | (2006.01) |
| *H01L 29/66* | (2006.01) |
| *H01L 29/32* | (2006.01) |
| *H01L 29/04* | (2006.01) |
| *H01L 21/02* | (2006.01) |

(52) U.S. Cl.
CPC ...... *H01L 29/7851* (2013.01); *H01L 21/02455* (2013.01); *H01L 21/02538* (2013.01); *H01L 29/045* (2013.01); *H01L 29/205* (2013.01); *H01L 29/32* (2013.01); *H01L 29/66522* (2013.01); *H01L 29/66795* (2013.01)

(58) Field of Classification Search
CPC .............. H01L 29/7851; H01L 21/02455; H01L 21/02538; H01L 21/823821
USPC ........................................... 257/192; 438/283
See application file for complete search history.

(56) References Cited

U.S. PATENT DOCUMENTS

| | | | |
|---|---|---|---|
| 8,309,447 B2 | 11/2012 | Cheng et al. | |
| 8,445,345 B2 | 5/2013 | Cheng et al. | |
| 8,575,653 B2* | 11/2013 | Rachmady ............. | B82Y 10/00 257/192 |
| 8,865,539 B2 | 10/2014 | Chen et al. | |
| 2008/0073667 A1* | 3/2008 | Lochtefeld ........ | H01L 29/66795 257/190 |
| 2013/0119347 A1* | 5/2013 | Cho .................. | H01L 29/66462 257/24 |
| 2014/0312423 A1 | 10/2014 | Cheng et al. | |
| 2014/0346564 A1 | 11/2014 | Doornbos et al. | |
| 2015/0021698 A1 | 1/2015 | Ando et al. | |
| 2015/0021699 A1 | 1/2015 | Ando et al. | |
| 2015/0034905 A1* | 2/2015 | Xiao ..................... | H01L 29/778 257/24 |

* cited by examiner

*Primary Examiner* — Cuong Q Nguyen
*Assistant Examiner* — Tony-Ho Kim
(74) *Attorney, Agent, or Firm* — Scully, Scott, Murphy & Presser, P.C.; Louis J. Percello, Esq.

(57) ABSTRACT

A semiconductor structure containing a multiple threshold voltage III-V device is provided. The III-V device includes a III-V compound semiconductor core portion and a III-V compound semiconductor shell portion. The III-V compound semiconductor core and shell portions are virtually defect-free. The III-V compound semiconductor core portion of the III-V device is used for back-gating to achieve multiple threshold voltages. The III-V compound semiconductor shell portion of the III-V device is used as a channel material for a field effect transistor.

20 Claims, 12 Drawing Sheets

III-V DEVICE STRUCTURE WITH MULTIPLE THRESHOLD VOLTAGE

BACKGROUND

The present application relates to a semiconductor structure and a method of forming the same. More particularly, the present application relates to a semiconductor structure that provides multiple threshold voltages in a III-V compound semiconductor device and a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

One way of improving the performance of CMOS devices is to utilize high mobility semiconductor channel materials. For example, III-V compound semiconductor materials have been touted for future technology nodes owning to their high carrier mobility. To render III-V compound semiconductor materials compatible with conventional CMOS, III-V compound semiconductor materials are typically grown on a silicon substrate utilizing an aspect ratio trapping (ART) process.

Multiple threshold voltage CMOS devices are highly desired to achieve optimum of both power and performance. Back-gating is a viable approach to achieve multiple threshold voltage CMOS devices. However, conventional back-gating does not work for III-V compound semiconductor materials formed by ART due to the high leakage current caused by a highly defective region that is formed within a lower portion of a III-V compound semiconductor material that is formed utilizing ART. As such, there is a need for enabling a III-V device having multiple threshold voltages which avoids the leakage problem mentioned above.

SUMMARY

A semiconductor structure containing a multiple threshold voltage III-V device is provided. The III-V device includes a III-V compound semiconductor core portion and a III-V compound semiconductor shell portion. The III-V compound semiconductor core and shell portions are virtually defect-free. The III-V compound semiconductor core portion of the III-V device is used for back-gating to achieve multiple threshold voltages. The III-V compound semiconductor shell portion of the III-V device is used as a channel material for a field effect transistor.

In one aspect of the present application, a semiconductor structure is provided. In one embodiment of the present application, the semiconductor structure includes a fin stack of, from bottom to top, a III-V compound semiconductor material fin portion, an insulating III-V compound material fin portion and a topmost III-V compound semiconductor material fin portion extending upwards from a surface of a bulk silicon substrate, wherein a dielectric material structure is present on each sidewall surface of the fin stack and each dielectric material structure has a topmost surface that is vertically offset and located at, or beneath, a bottommost surface of the topmost III-V compound semiconductor material fin portion. An insulating III-V compound layer straddles over a first portion of the topmost III-V compound semiconductor material fin portion and a III-V compound semiconductor layer is located on the insulating III-V compound layer. A functional gate structure straddles over a portion of the III-V compound semiconductor layer. In accordance with the present application, a second portion of the topmost III-V compound semiconductor material fin portion is exposed and is used as a backgate.

In another aspect of the present application, a method of forming a semiconductor structure is provided. In one embodiment of the present application, the method includes providing a fin stack of, from bottom to top, a III-V compound semiconductor material fin portion, an insulating III-V compound material fin portion and a topmost III-V compound semiconductor material fin portion extending upwards from a surface of a bulk silicon substrate, wherein a dielectric material structure is present on each sidewall surface of the fin stack and each dielectric material structure has a topmost surface that is vertically offset and located at, or beneath, a bottommost surface of the topmost III-V compound semiconductor material fin portion. Next, an insulating III-V compound layer is formed straddling over the topmost III-V compound semiconductor material fin portion. A III-V compound semiconductor layer is then formed on the insulating III-V compound layer. Next, a gate structure is formed straddling over a portion of the III-V compound semiconductor layer. The topmost III-V compound semiconductor material fin portion at an end of the fin stack opposite an end containing the gate structure is thereafter exposed.

DETAILED DESCRIPTION

Figure 1:
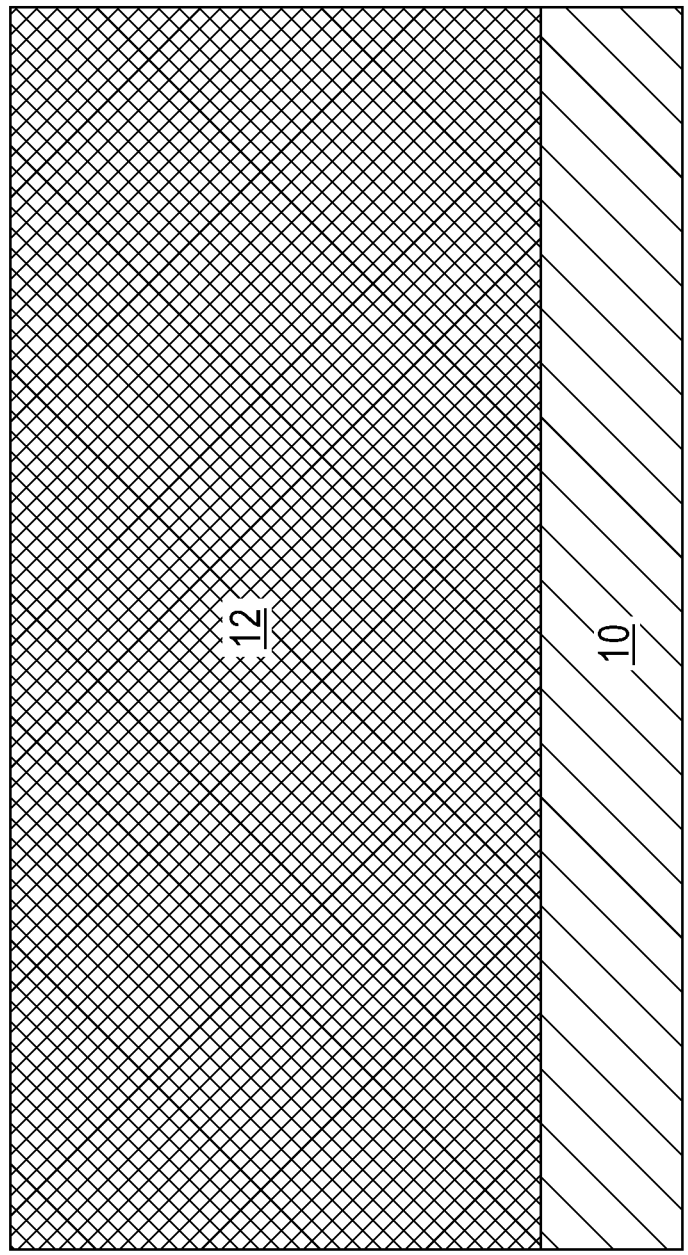
FIG. 1 is a cross sectional view of an exemplary semiconductor structure including a dielectric material layer located on a topmost surface of a bulk silicon substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a dielectric material layer 12 located on a topmost surface of a bulk silicon substrate 10 that can be employed in accordance with an embodiment of the present application.

The term "bulk" as used in conjunction with the phrase "silicon substrate" denotes that the entire substrate is comprised of silicon. The bulk silicon substrate 10 that can be employed in the present application is single crystalline silicon. The crystal orientation of the bulk silicon substrate 10 may be {100}, {110}, or {111}. Other crystallographic orientations besides those specifically mentioned can also be used in the present application. Typically, the bulk silicon substrate 10 has a {100} crystal orientation.

The dielectric material layer 12 that is present on a topmost surface of the bulk silicon substrate 10 is a contiguous layer that covers the entirety of the topmost surface of the bulk silicon substrate 10. The dielectric material layer 12 that is employed in the present application may include a semiconductor oxide, a semiconductor nitride and/or a semiconductor oxynitride. In one embodiment, the dielectric material that can be used in providing the dielectric material layer 12 can be comprised of silicon dioxide. In another embodiment, the dielectric material that can be used in providing the dielectric material layer 12 can be comprised of silicon nitride. In yet another embodiment, the dielectric material that can be used in providing the dielectric material layer 12 can be a stack comprised of, in any order, silicon dioxide and silicon nitride.

In some embodiments, the dielectric material that can be used in providing the dielectric material layer 12 can be formed by a deposition process such as, for example, chemical vapor deposition (CVD) or plasma enhanced chemical vapor deposition (PECVD). In other embodiments, the dielectric material that can be used in providing the dielectric material layer 12 can be formed by a thermal process such as, for example, thermal oxidation and/or thermal nitridation. In yet other embodiments, the dielectric material that can be used in providing the dielectric material layer 12 can be formed by a combination of a deposition process and a thermal process. In one embodiment of the present application, the thickness of the dielectric material that can be used in providing the dielectric material layer 12 can range from 20 nm to 500 nm, with a thickness from 30 nm to 150 nm being more typical.

Figure 2:
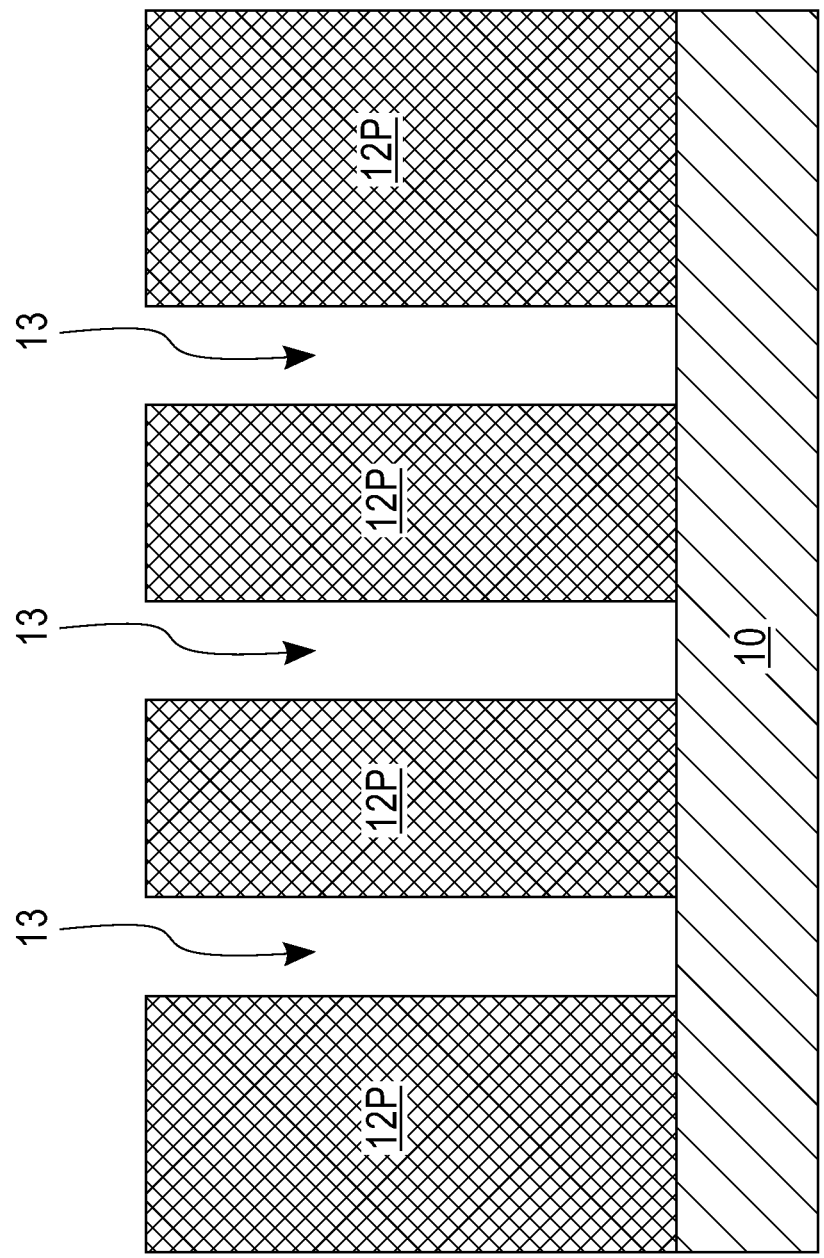
FIG. 2 is a cross sectional view of the exemplary semiconductor structure of FIG. 1 after forming a plurality of trenches within the dielectric material layer.

Referring now to FIG. 2, there is illustrated the exemplary semiconductor structure of FIG. 1 after forming a plurality of trenches 13 within the dielectric material layer 12. Each trench 13 that is formed extends entirely through the dielectric material layer 12 and exposes an underlying portion of the topmost surface of the bulk silicon substrate 10. Each trench 13 that is formed has an aspect ratio, i.e., trench width to trench height, which is from 1:3 to 1:10. Other aspect ratios are possible as long as the trench height is at least 2 times greater than the trench width. The portions of the dielectric material layer 12 that remain after trench 13 formation may be referred to herein as a dielectric material layer portion 12P. Although a plurality of trenches 13 are described and illustrated, a single trench 13 can be formed in the present application.

Each trench 13 is formed utilizing a patterning process. In one embodiment of the present application, the patterning process comprises a sidewall image transfer (SIT) process. The SIT process includes forming a contiguous mandrel material layer (not shown) over the dielectric material layer 12. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers entirely through the dielectric material layer 12 and stopping on a topmost surface of the bulk silicon substrate 10. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process that is used in providing the trenches 13 can include lithography and etching. Lithography includes forming a photoresist material (not shown) on a topmost surface of the dielectric material layer 12. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the dielectric material layer 12. The pattern provided by the patterned photoresist material is thereafter transferred into the underlying material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

Figure 3:
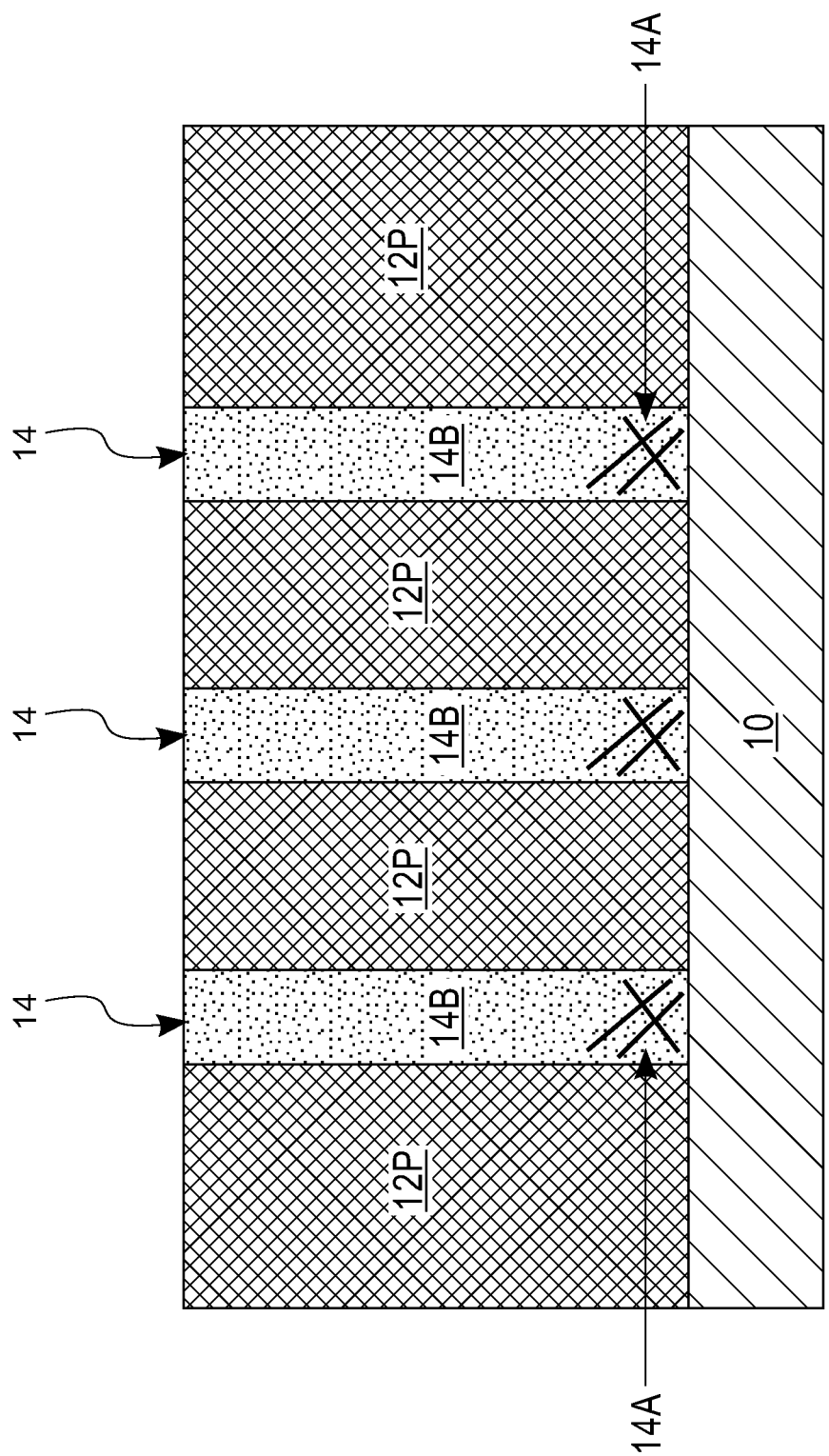
FIG. 3 is a cross sectional view of the exemplary semiconductor structure of FIG. 2 after forming a III-V compound semiconductor material fin extending upwards from an exposed portion of the topmost surface of the bulk silicon substrate and within each of the trenches.

Referring now to FIG. 3, there is illustrated the exemplary semiconductor structure of FIG. 2 after forming a III-V compound semiconductor material fin 14 extending upwards from an exposed portion of the topmost surface of the bulk silicon substrate 10 and within each of the trenches 13. Each III-V compound semiconductor material fin 14 that is formed includes a lower portion (indicated by "χ" in the drawings and labeled as element 14A) having a first defect density and an upper portion (not including the "χ" and labeled as 14B) having a second defect density that is less than the first defect density.

The term "III-V compound semiconductor" denotes a semiconductor material that has semiconductor properties and includes at least one element from Group III (i.e., B, Al, Ga, and/or In) of the Periodic Table of Elements and at least one element from Group V (i.e., N, P, As, Sb and/or Bi) of the Periodic Table of Elements. The range of possible formulae is quite broad because the elements can form binary compound semiconductors, tertiary compound semiconductors and even quaternary compound semiconductors. In one embodiment of the present application, InAs, GaAs, or InP can be used as the III-V compound semiconductor that provides each III-V compound semiconductor material fin 14. Each III-V compound semiconductor material fin 14 that is formed has a first band gap. In one embodiment of the present application, each III-V compound semiconductor material fin 14 comprises a III-V compound material that has a first band gap from 0.3 eV to 1.4 eV.

Each III-V compound semiconductor material fin 14 that is provided can be formed utilizing an aspect ratio trapping or epitaxial semiconductor regrowth process such as is described, for example, in U.S. Patent Application Publication No. 2011/0049568 to Lochtefeld et al., the entire content and disclosure of which is incorporated herein by reference. Notably, and since an epitaxial semiconductor regrowth process is used in forming each III-V compound semiconductor material fin 14, each III-V compound semiconductor material fin 14 has a same crystalline characteristic as the semiconductor material of the deposition surface. Thus, in the present application, each III-V compound semiconductor material fin 14 has an epitaxial relationship, i.e., same crystal orientation, with the underlying bulk silicon substrate 10.

Each III-V compound semiconductor material fin 14 that is formed includes a pair of vertical sidewalls that are parallel to each other. As used herein, a surface is "vertical" if there exists a vertical plane from which the surface does not deviate by more than three times the root mean square roughness of the surface. Each III-V compound semiconductor material fin 14 that is formed includes a pair of sidewalls that are parallel to each other. Each III-V compound semiconductor material fin 14 has a width from 5 nm to 30 nm and a length from 100 nm to 2000 nm. The length of each III-V compound semiconductor material fin 14 runs into and out of the plane of FIG. 4. Other widths and lengths are possible and can be used in the present application for each III-V compound semiconductor material fin 14.

In some embodiments of the present application, the selected crystallographic direction of each III-V compound semiconductor material fin 14 is aligned with at least one propagation direction of threading dislocations in the trench 13 in which a III-V compound semiconductor material fin 14 is formed. Threading dislocations in this region may substantially terminate at a sidewall of the neighboring dielectric material layer portions 12P.

Each III-V compound semiconductor material fin 14 can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metalorganic CVD (MOCVD) or by atomic layer deposition (ALD). In the CVD process, selective epitaxial growth typically includes introducing a source gas into the chamber. The source gas may include at least one precursor gas (or mixture of gases) that can form a III-V compound semiconductor material and a carrier gas, such as, for example hydrogen. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

As is shown, each III-V compound semiconductor material fin 14 has a topmost surface that is coplanar with a topmost surface of each dielectric material layer portion 12P and a bottommost surface that is in direct contact with a topmost surface of the bulk silicon substrate 10.

Figure 4:
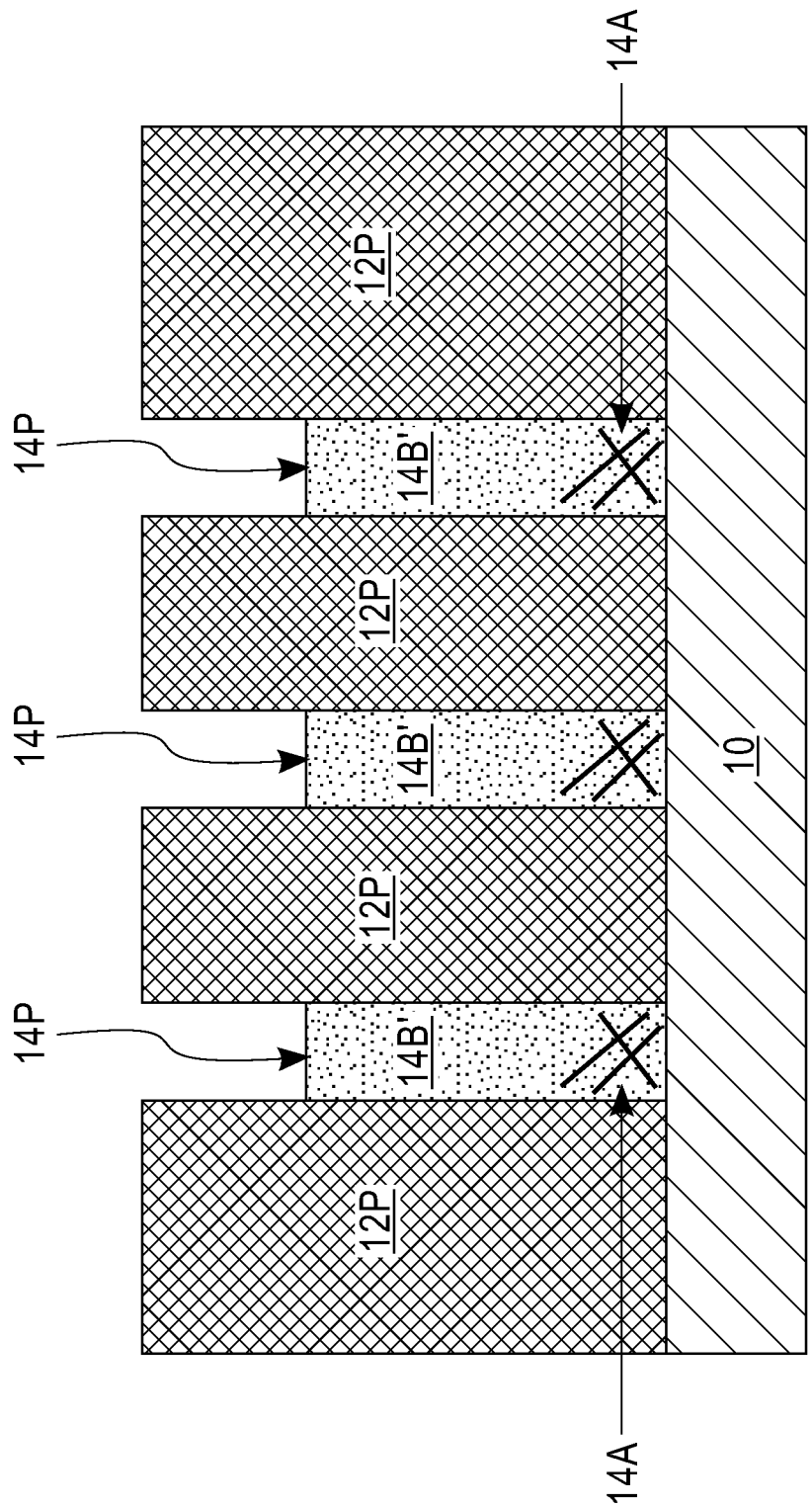
FIG. 4 is a cross sectional view of the exemplary semiconductor structure of FIG. 3 after recessing an upper portion of each III-V compound semiconductor material fin to provide a III-V compound semiconductor material fin portion within each of the trenches.

Referring now to FIG. 4, there is illustrated the exemplary semiconductor structure of FIG. 3 after recessing an upper portion of each III-V compound semiconductor material fin 14 to provide a III-V compound semiconductor material fin portion 14P within each of the trenches 13. Each III-V compound semiconductor material fin portion 14P comprises a remaining portion of the each III-V compound semiconductor material fin 14. Each III-V compound semiconductor material fin portion 14P includes the lower portion 14A having the first defect density and a remaining portion of upper portion 14B having the second defect density that is less than the first defect density. The remaining upper portion of each III-V compound semiconductor material fin portion 14P can be referred to herein as III-V semiconductor epitaxial seed portion 14B'. Since each III-V compound semiconductor material fin portion 14P comprises a remaining portion of the previously formed III-V compound semiconductor material fin 14, each III-V compound semiconductor material fin portion 14P has the first band gap mentioned above. Each III-V compound semiconductor material fin portion 14P has a topmost surface that is vertically offset and located beneath a topmost surface of each dielectric material layer portion 12P. In one embodiment of the present application, the topmost surface of each III-V compound semiconductor material fin portion 14P is recessed to a depth that is from 30 nm to 200 nm below the topmost surface of each dielectric material layer portion 12P.

The recessing of each III-V compound semiconductor material fin 14 can be performed utilizing an etching process that is selective in removing a III-V compound semiconductor as compared to the dielectric material of each dielectric material layer portion 12P. In one embodiment, the etching used to recess each III-V compound semiconductor material fin 14 can be a reactive ion etch in which a chloride based etchant is used.

Figure 5:
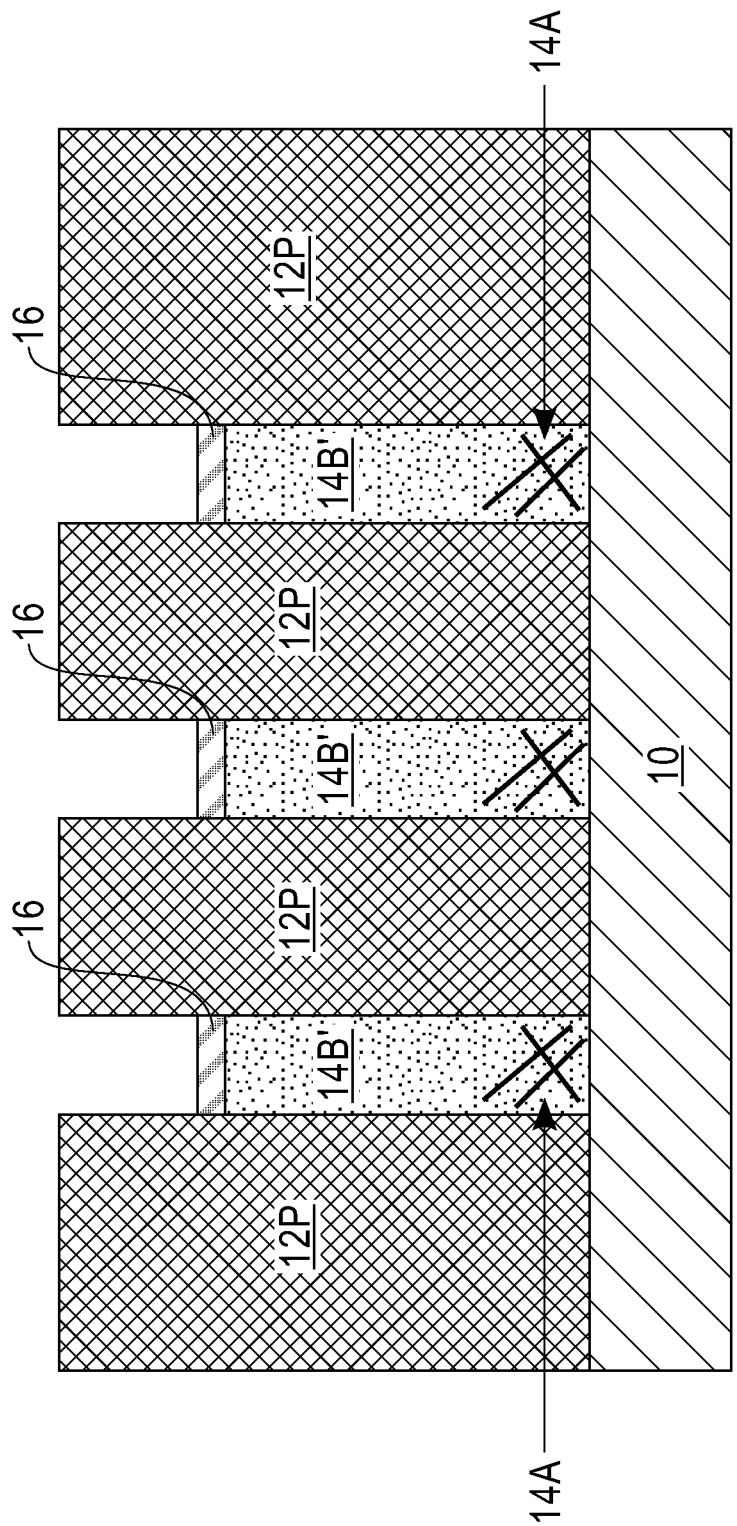
FIG. 5 is a cross sectional view of the exemplary semiconductor structure of FIG. 4 after forming an insulating III-V compound material fin portion on an exposed topmost surface of each III-V compound semiconductor material fin portion.

Referring now to FIG. 5, there is illustrated the exemplary semiconductor structure of FIG. 4 after forming an insulating III-V compound material fin portion 16 on an exposed topmost surface of each III-V compound semiconductor material fin portion 14P (i.e. on an exposed surface of each III-V semiconductor epitaxial seed portion 14B').

The term "insulating III-V compound material" denotes an insulating or semi-insulating material that has insulating properties and includes at least one element from Group III (i.e., B, Al, Ga, and/or In) of the Periodic Table of Elements and at least one element from Group V (i.e., N, P, As, Sb and/or Bi) of the Periodic Table of Elements. Each insulating III-V compound material fin portion 16 comprises a III-V compound material that has a second band gap that is greater than the first band gap mentioned above for each III-V compound semiconductor material fin 14. In one embodiment of the present application, each insulating III-V compound material fin portion 16 comprises a III-V compound material that has a band gap from 1.6 eV to 2.5 eV. In one example and when each III-V compound semiconductor material fin 14 comprises InP, InAlAs can be used as the insulating III-V compound material fin portion 16. Each insulating III-V compound material fin portion 16 is lattice matched to the III-V compound semiconductor of each III-V compound semiconductor material fin 14.

Each insulating III-V compound material fin portion 16 can be formed by an epitaxial growth (or epitaxial deposition process). The terms "epitaxial growth and/or deposition" and "epitaxially formed and/or grown" mean the growth of a material on a deposition surface of a base material, in which the material being grown has the same crystalline characteristics as the deposition surface of the base material. In an epitaxial deposition process, the chemical reactants provided by the source gases are controlled and the system parameters are set so that the depositing atoms arrive at the deposition surface of the base material with sufficient energy to move around on the surface and orient themselves to the crystal arrangement of the atoms of the deposition surface of the base material. Therefore, a material that is formed by an epitaxial deposition process has the same crystalline characteristics as the deposition surface of the base material on which it is formed. For example, an epitaxial material deposited on a {100} crystal surface will take on a {100} orientation. As such, each insulating III-V compound material fin portion 16 has an epitaxial relationship, i.e., same crystal orientation, as that of the exposed topmost surface of each III-V semiconductor epitaxial seed portion 14B'. Each insulating III-V compound material fin portion 16 has the second defect density mentioned above.

Examples of various epitaxial growth processes that are suitable for use in forming each insulating III-V compound material fin portion 16 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metalorganic CVD (MOCVD). The temperature for epitaxial deposition typically ranges from 250° C. to 900° C. Although higher temperature typically results in faster deposition, the faster deposition may result in crystal defects and film cracking. A number of well known III-V compound precursor source gases may be used for the deposition of the each insulating III-V compound material fin portion 16. Carrier gases like hydrogen, nitrogen, helium and argon can be used. In some embodiments and following the epitaxial growth of each insulating III-V compound material fin portion 16, a recess etch can be used. In some embodiments, no recess etch is necessary.

Each insulating III-V compound material fin portion 16 has a topmost surface that is vertically offset and located beneath a topmost surface of each dielectric material layer portion 12P. The thickness of each insulating III-V compound material fin portion 16 can be from 5 nm to 20 nm.

Other thicknesses that are lesser than, or greater than, the aforementioned thickness range may also be used in the present application as the thickness of each insulating III-V compound material fin portion 16.

Figure 6:
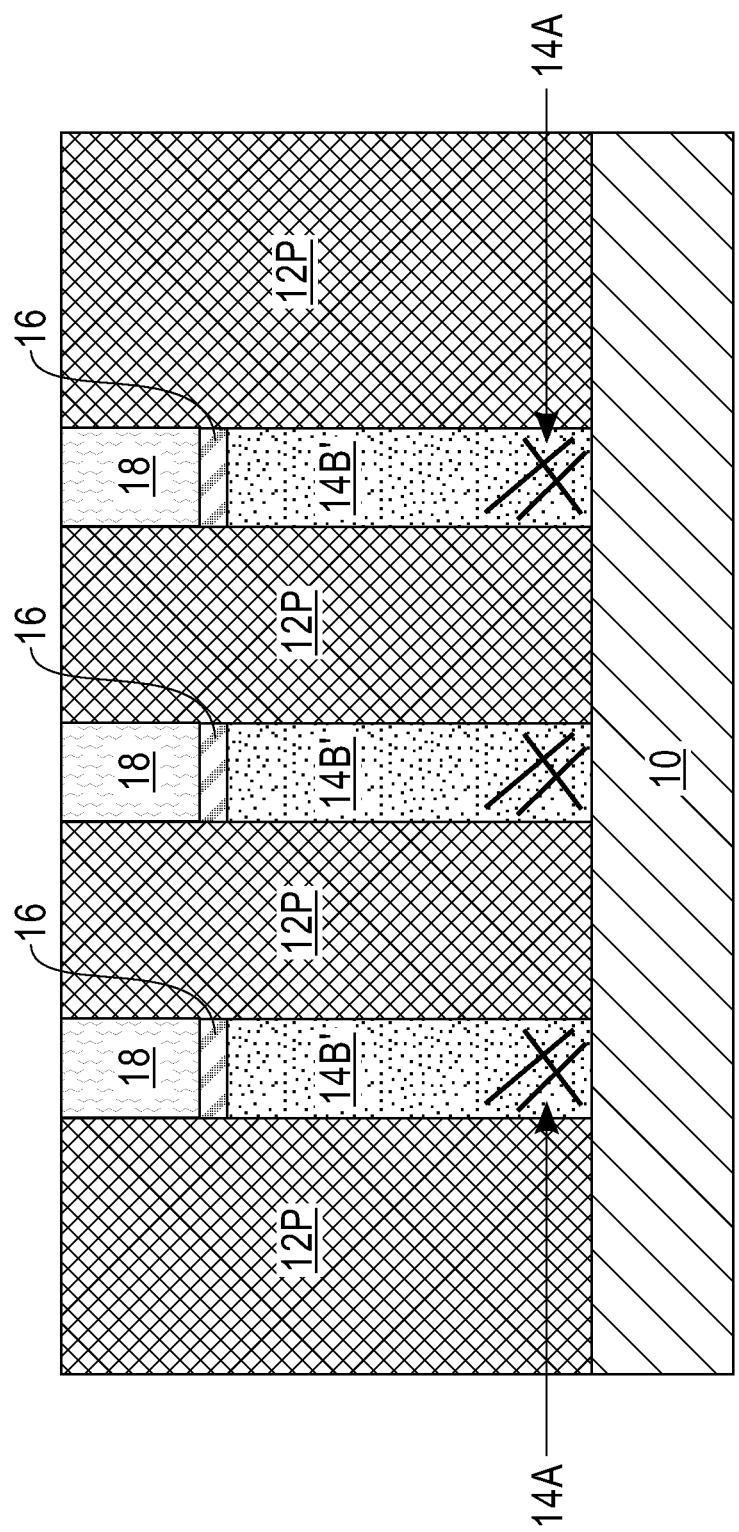
FIG. 6 is a cross sectional view of the exemplary semiconductor structure of FIG. 5 after forming a topmost III-V compound semiconductor material fin portion on a topmost surface of each insulating III-V compound material fin portion.

Referring now to FIG. 6, there is illustrated the exemplary semiconductor structure of FIG. 5 after forming a topmost III-V compound semiconductor material fin portion 18 on a topmost surface of each insulating III-V compound material fin portion 16. Each topmost III-V compound semiconductor material fin portion 18 may also be referred to herein as a III-V compound semiconductor core portion. As is shown, each topmost III-V compound semiconductor material fin portion 18 has a topmost surface that is coplanar with a topmost surface of each dielectric material layer portion 12P. Collectively, a vertical stack of the topmost III-V compound semiconductor material fin portion 18, the insulating III-V compound material fin portion 16, and the III-V compound semiconductor material fin portion 14P constitutes a fin stack of the present application. The fins stack (14P, 16, 18) has a width and a length that is the same as the width and length of each III-V compound semiconductor material fin 14.

Each topmost III-V compound semiconductor material fin portion 18 comprises one of the III-V compound semiconductor materials mentioned above for III-V compound semiconductor material fin 14. In one embodiment, each topmost III-V compound semiconductor material fin portion 18 comprises a same III-V compound semiconductor material as each III-V compound semiconductor material fin 14. In another embodiment, each topmost III-V compound semiconductor material fin portion 18 comprises a different III-V compound semiconductor material than each III-V compound semiconductor material fin 14. Each topmost III-V compound semiconductor material fin portion 18 is lattice matched with the underlying insulating III-V compound material fin portion 16. In one example, each topmost III-V compound semiconductor material fin portion 18 comprises InGaAs. Each topmost III-V compound semiconductor material fin portion 18 has the second defect density mentioned above.

Each topmost III-V compound semiconductor material fin portion 18 can be formed by one of the epitaxial growth processes mentioned above in forming each insulating III-V compound material fin portion 16. Since an epitaxial growth process is used in forming each topmost III-V compound semiconductor material fin portion 18, each topmost III-V compound semiconductor material fin portion 18 has an epitaxial relationship with an underlying insulating III-V compound material fin portion 16. In some embodiments, and following the epitaxial growth process, an etch back or planarization process can be used to provide the exemplary semiconductor structure of the present application.

Figure 7:
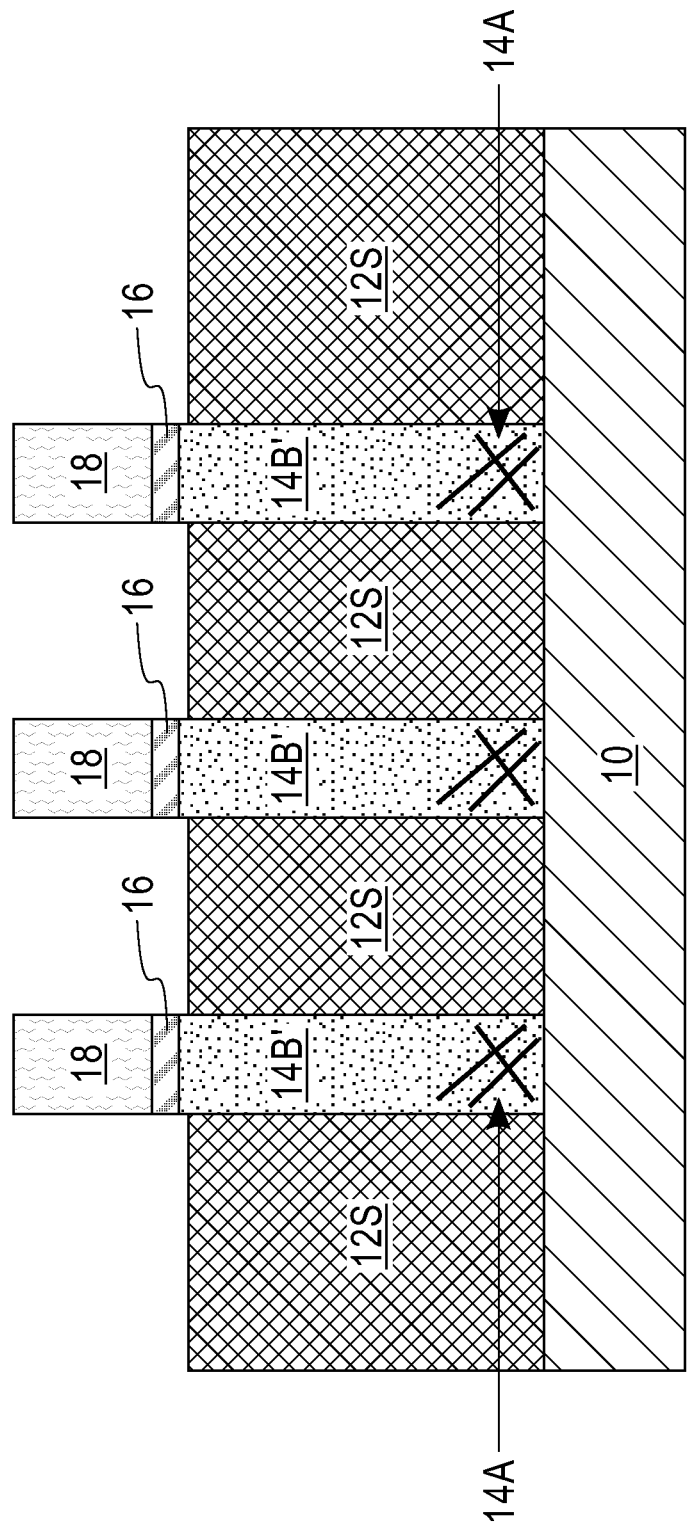
FIG. 7 is a cross sectional view of the exemplary semiconductor structure of FIG. 6 after recessing an upper portion of each remaining portion of the dielectric material layer to expose sidewall surfaces and a topmost surface of each topmost III-V compound semiconductor material fin portion and sidewall surfaces of each underlying insulating III-V compound material fin portion.

Referring now to FIG. 7, there is illustrated the exemplary semiconductor structure of FIG. 6 after recessing an upper portion of each remaining portion of the dielectric material layer (i.e., each dielectric material layer portion 12P) to expose sidewall surfaces and a topmost surface of each topmost III-V compound semiconductor material fin portion 18 and, optionally, sidewall surfaces of each underlying insulating III-V compound material fin portion 16. The remaining portions of each dielectric material layer portion 12P may be referred to herein as dielectric material structure 12S.

The recessing of the upper portion of each dielectric material layer portion 12P may comprise an etching process that is selective in removing the dielectric material that provides each dielectric material layer portion 12P relative to a III-V compound material. In one embodiment, the etching process is a reactive ion etch. In another embodiment, a wet etch process may be used to recess the upper portion of each dielectric material layer portion 12P.

The topmost surface of each dielectric material structure 12S that is formed is vertically offset and located at, or beneath, a bottommost surface of the topmost III-V compound semiconductor material fin portion 18. Thus, each dielectric material structure 12S does not cover the topmost III-V compound semiconductor material fin portion 18 of the fin stack. In one embodiment, the topmost surface of each dielectric material structure 12S is coplanar with a bottommost surface of the insulating III-V compound material fin portion 16. In other embodiments, the topmost surface of each dielectric material structure 12S that is formed is located between the topmost and bottommost surface of the insulating III-V compound material fin portion 16. In yet other embodiments, the topmost surface of each dielectric material structure 12S that is formed is located beneath a bottommost surface of the insulating III-V compound material fin portion 16, but not extending to the lower portion 14A of each III-V compound semiconductor material fin portion 14P.

Figure 8:
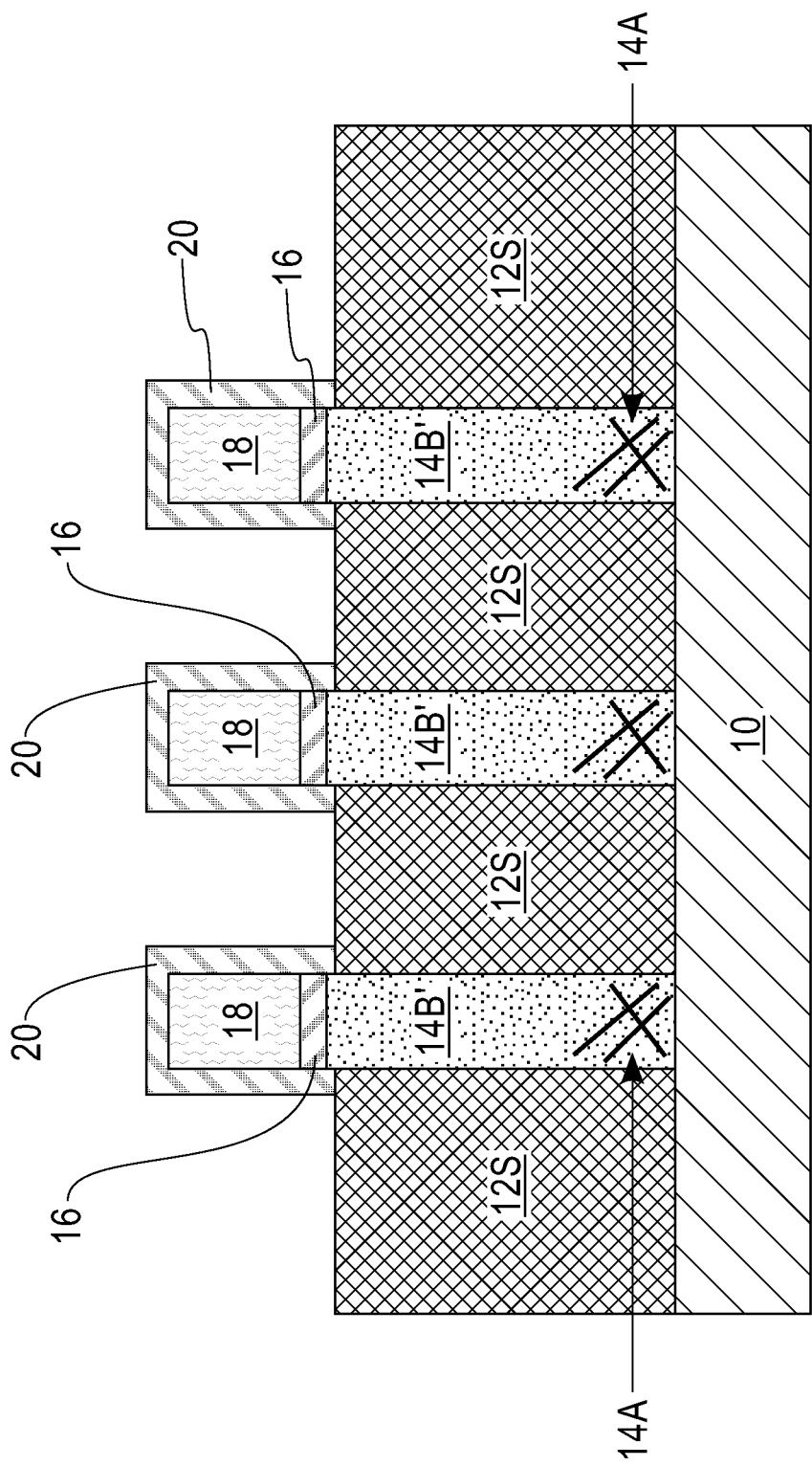
FIG. 8 is a cross sectional view of the exemplary semiconductor structure of FIG. 7 after forming an insulating III-V compound layer on exposed surfaces of each topmost III-V compound semiconductor material fin portion and each underlying insulating III-V compound material fin portion.

Referring now to FIG. 8, there is illustrated the exemplary semiconductor structure of FIG. 7 after forming an insulating III-V compound layer 20 on exposed surfaces of each topmost III-V compound semiconductor material fin portion 18 and, if exposed, each underlying insulating III-V compound material fin portion 16. As is shown, the insulating III-V compound layer 20 wraps around the exposed surfaces of topmost III-V compound semiconductor material fin portion 18 and the insulating III-V compound material fin portion 16. As is also shown, portions of each insulating III-V compound layer 20 are also present on the dielectric material structures 12S.

Each insulating III-V compound layer 20 comprises one of the III-V compound materials as mentioned above for the insulating III-V compound material fin portion 16. In one embodiment, each insulating III-V compound layer 20 comprises a same III-V compound material as the insulating III-V compound material fin portion 16. In another embodiment, each insulating III-V compound layer 20 comprises a different III-V compound material than the insulating III-V compound material fin portion 16. Each insulating III-V compound layer 20 is lattice matched with the topmost III-V compound semiconductor material fin portion 18. In one example, each insulating III-V compound layer 20 comprises InAlAs. Each insulating III-V compound layer 20 has the second defect density mentioned above.

Each insulating III-V compound layer 20 can be formed by one of the epitaxial growth processes mentioned above in forming each insulating III-V compound material fin portion 16. Since an epitaxial growth process is used in forming each insulating III-V compound layer 20, each insulating III-V compound layer 20 has an epitaxial relationship with at least the topmost III-V compound semiconductor material fin portion 18.

Figure 9:
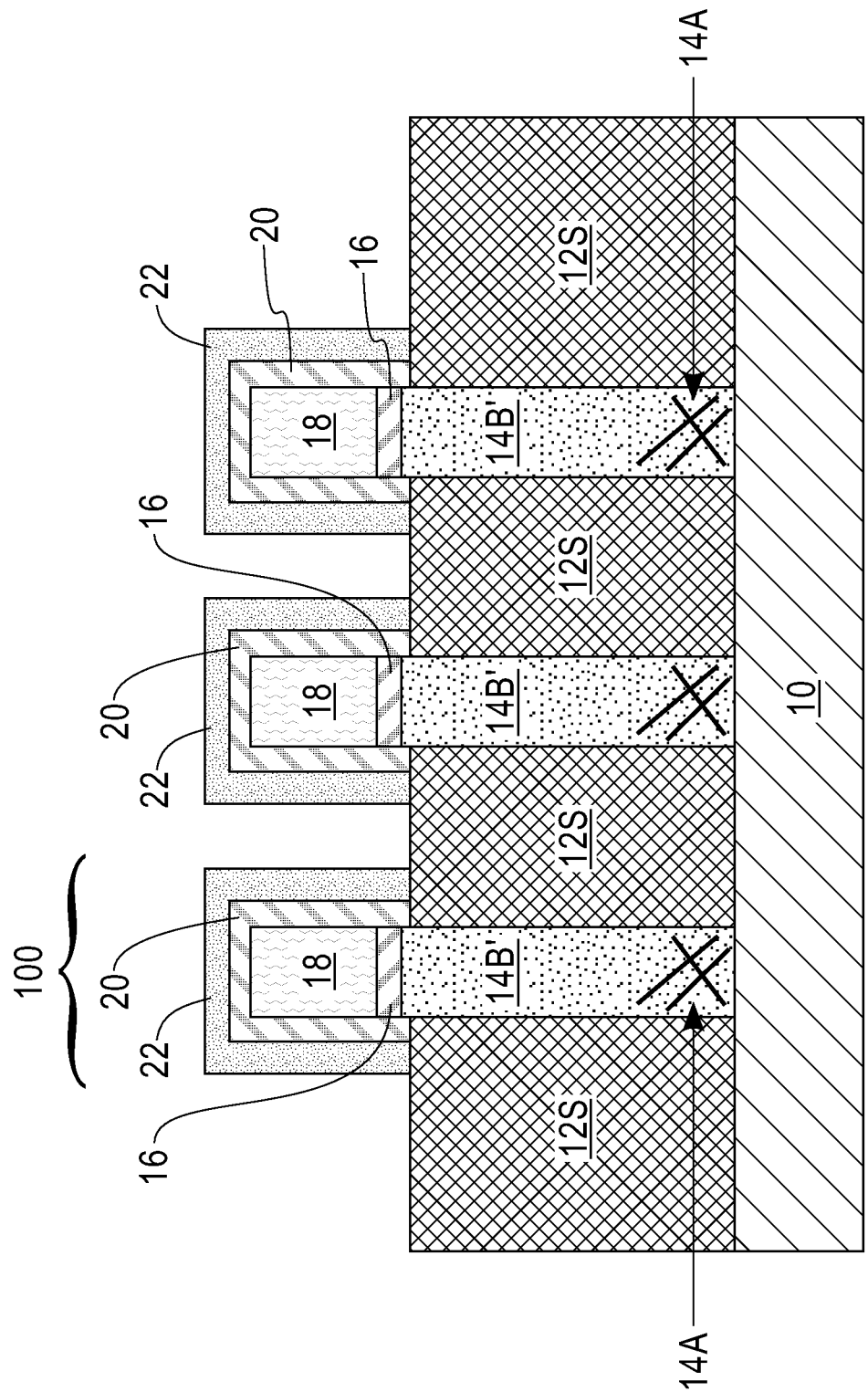
FIG. 9 is a cross sectional view of the exemplary semiconductor structure of FIG. 8 after forming a III-V compound semiconductor layer on exposed surfaces of the insulating III-V compound layer.

Referring now to FIG. 9, there is illustrated the exemplary semiconductor structure of FIG. 8 after forming a III-V compound semiconductor layer 22 on exposed surfaces of the insulating III-V compound layer 20. As is shown, portions of each III-V compound semiconductor layer 22 contact a topmost surface of an underlying dielectric material structure 12S. Each III-V compound semiconductor layer 22 may also be referred to herein as III-V compound semiconductor shell portion. In FIG. 9, reference 100 denotes one device region including one device of the present application.

Each III-V compound semiconductor layer 22 comprises one of the III-V compound semiconductor materials as mentioned above for III-V compound semiconductor material fin 14. In some embodiments, each III-V compound semiconductor layer 22 comprises a same III-V compound semiconductor material as each topmost III-V compound semiconductor material fin portion 18. In another embodiment, each III-V compound semiconductor layer 22 comprises a different III-V compound semiconductor material than each topmost III-V compound semiconductor material fin portion 18. Each III-V compound semiconductor layer 22 is lattice matched with the underlying insulating III-V compound layer 20. In one example, each III-V compound semiconductor layer 22 comprises InGaAs. Each III-V compound semiconductor layer 22 has the second defect density mentioned above.

Each III-V compound semiconductor layer 22 can be formed by one of the epitaxial growth processes mentioned above in forming each insulating III-V compound material fin portion 16. Since an epitaxial growth process is used in forming each III-V compound semiconductor layer 22, each III-V compound semiconductor layer 22 has an epitaxial relationship with an underlying insulating III-V compound layer 20.

Figure 10A:
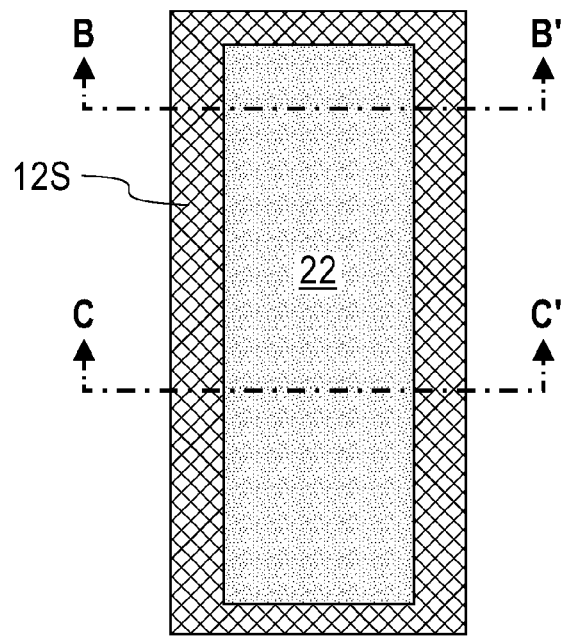
FIG. 10A is a top down view illustrating an exemplary device within a single device region highlighted in FIG. 9.
Figure 10B:
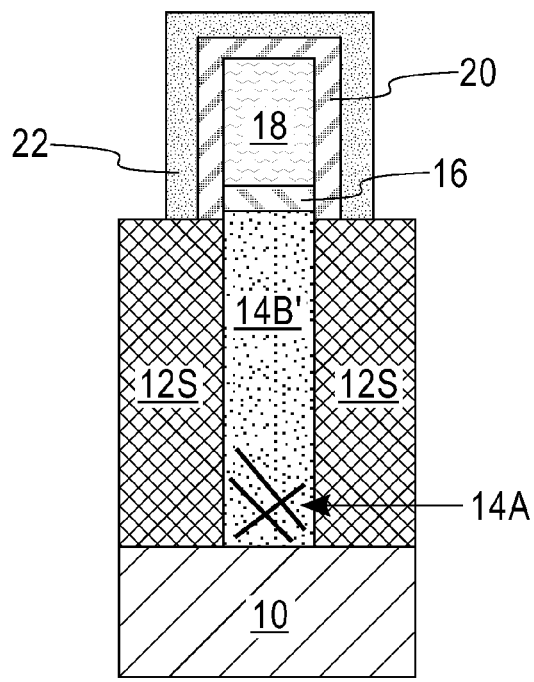
FIG. 10B is a cross sectional view of the exemplary device of FIG. 10A along vertical plane B-B'.
Figure 10C:
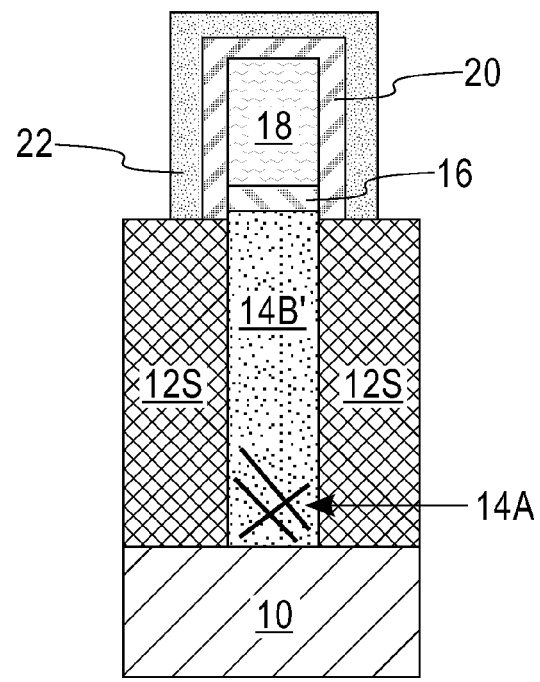
FIG. 10C is a cross sectional view of the exemplary device of FIG. 10A along vertical plane C-C'.

Referring now to FIGS. 10A, 10B and 10C, there are shown various views of an exemplary device within device region 100 that is highlighted in FIG. 9.

Figure 11A:
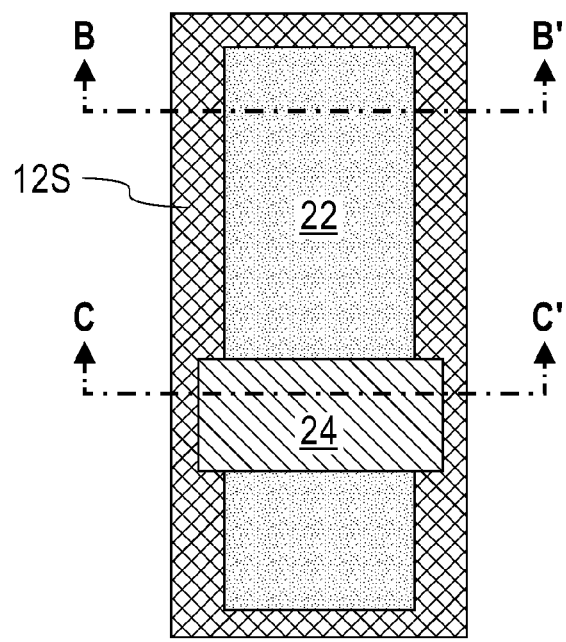
FIG. 11A is a top down view of the exemplary device shown in FIGS. 10A-10C after forming a gate structure straddling over a portion of the III-V compound semiconductor layer.
Figure 11B:
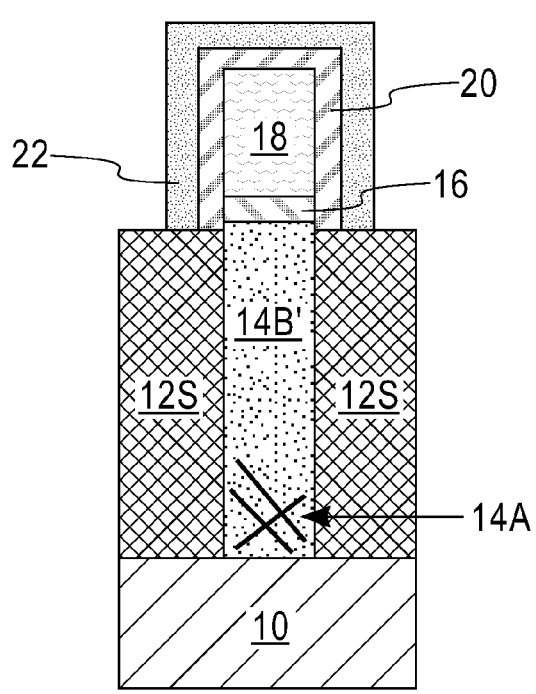
FIG. 11B is a cross sectional view of the exemplary device of FIG. 11A along vertical plane B-B'.
Figure 11C:
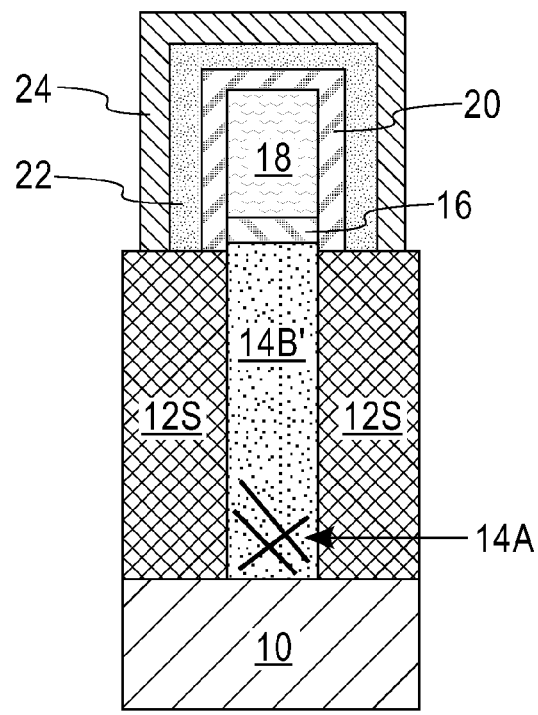
FIG. 11C is a cross sectional view of the exemplary device of FIG. 11A along vertical plane C-C'.

Referring now to FIGS. 11A, 11B and 11C, there are shown various views of the exemplary device shown in FIGS. 10A-10C after forming a gate structure 24 straddling over a portion of the III-V compound semiconductor layer 22; similar gate structures are formed over the other device regions of the exemplary semiconductor structure shown in FIG. 9. By "straddle over or straddling over" it is meant that at least one portion of a gate structure is located on one side the III-V compound semiconductor layer 22, while another portion of the same gate structure is located on another side of the III-V compound semiconductor layer 22. The two portions are interconnected by a portion of the gate structure that is located directly atop the III-V compound semiconductor layer 22. As shown, the gate structure has portions that contact other portions of the topmost surface of an underlying dielectric material structure 12S.

In one embodiment of the present application and as shown, the gate structure 24 is a functional gate structure. By "functional gate structure" it is meant a permanent gate structure used to control output current (i.e., flow of carriers in the channel) of a semiconducting device through electrical or magnetic fields. The functional gate structure that may comprise gate structure 24 includes a gate material stack of, from bottom to top, a gate dielectric portion and a gate conductor portion. In some embodiments, a gate cap portion can be present atop the gate conductor portion. Although a single functional gate structure is described and illustrated, a plurality of functional gate structures straddling over different portions of the III-V compound semiconductor layer 22 may be formed.

The gate dielectric portion of the functional gate structure comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric portion. In some embodiments and with respect to the other device regions, each gate dielectric portion comprises a same gate dielectric material. In other embodiments and with respect to the other device regions, at least one of the gate dielectric portions comprises a different gate dielectric material than at least one other gate dielectric portion.

The gate dielectric material used in providing the gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of the different functional gate structures, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

The gate conductor portion of the functional gate structure comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments and with respect to the other device regions, each gate conductor portion comprises a same gate conductor material. In other embodiments and with respect to the other device regions, at least one of the gate conductor portions comprises a different gate conductor material than at least one other gate conductor portion. For example, at least one of the gate conductor portions may comprise an nFET gate metal, while at least one other of the gate conductor portions may comprise a pFET gate metal.

The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for at least one of gate conductor portions, block mask technology can be used. In one embodiment, the gate conductor material used in providing the gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion of the functional gate structure comprises a gate cap material. The gate cap material that provides the gate cap portion may include one of the dielectric materials mentioned above for the dielectric material layer 12. In one embodiment, each gate cap portion comprises silicon dioxide, silicon nitride, and/or silicon oxynitride. The dielectric material that provides the gate cap portion can be formed utilizing a conventional deposition process such as, for example, chemical vapor deposition or plasma enhanced chemical vapor deposition. The dielectric material that provides the gate cap portion can has a thickness from 5 nm to 20 nm. Other thicknesses that are lesser than, or greater than, the aforementioned thickness range can also be employed as the thickness of the dielectric material that provides the gate cap portion.

The functional gate structures can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching, as defined above.

In other embodiments of the present application, the gate structure 24 is a sacrificial gate structure instead of a functional gate structure. In yet other embodiments, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structure 24 (functional and/or sacrificial gate structures), dielectric spacers (not shown) can be formed on exposed sidewall surfaces of the gate structure 24. The dielectric spacers may comprise one of the dielectric materials mentioned above for dielectric material layer 12. The dielectric spacers can be formed by depositing a spacer material and thereafter a spacer etch can be performed.

Figure 12A:
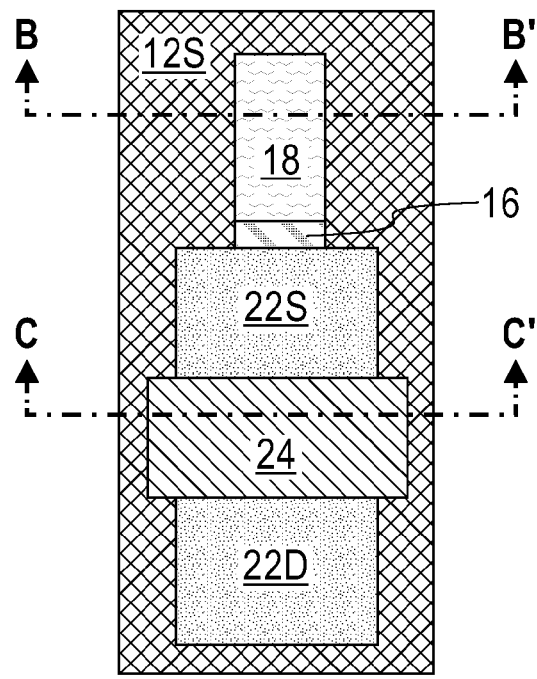
FIG. 12A is a top down view of the exemplary device shown in FIGS. 11A-11C after forming a source region on one side of the gate structure and within an exposed first portion of the III-V compound semiconductor layer, a drain region on another side of the gate structure and within an exposed second portion of the III-V compound semiconductor layer, and removing the III-V compound semiconductor layer and the insulator III-V compound layer from one end of the device, that is opposite an end containing the gate structure.
Figure 12B:
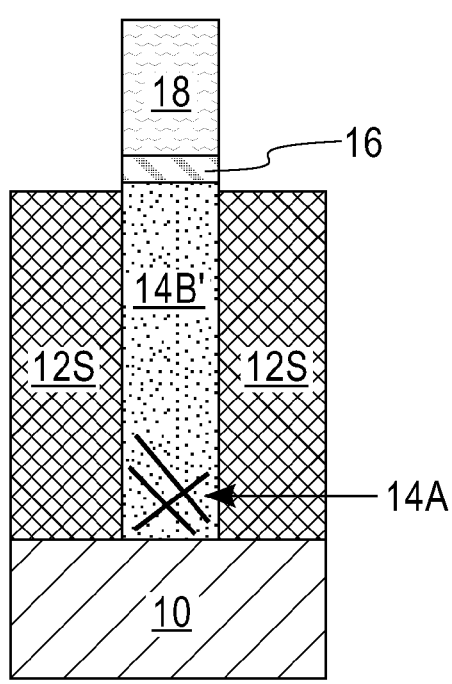
FIG. 12B is a cross sectional view of the exemplary device of FIG. 12A along vertical plane B-B'.
Figure 12C:
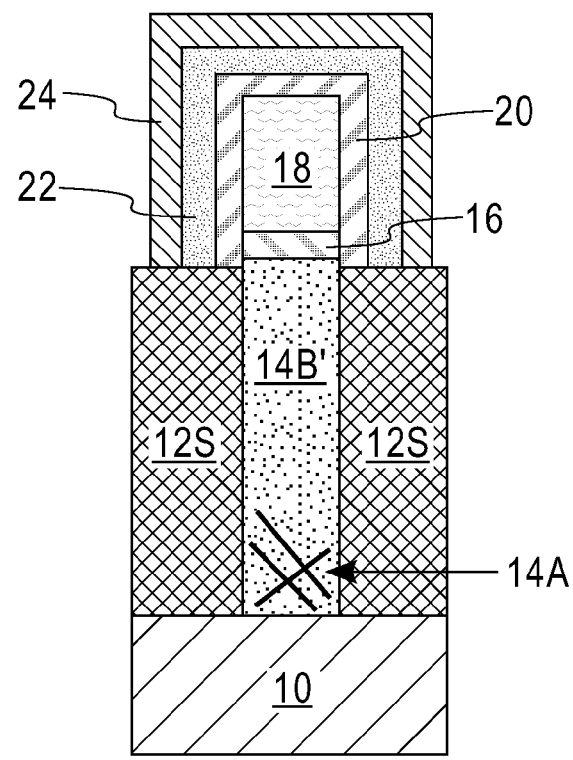
FIG. 12C is a cross sectional view of exemplary device of FIG. 12A along vertical plane C-C'.

Referring now to FIGS. 12A, 12B and 12C, there are shown various views of the exemplary device shown in FIGS. 11A, 11B, 11C after forming, in any order, a source region 22S on one side of the gate structure 24 and within an exposed first portion of the III-V compound semiconductor layer 22, a drain region 22D on another side of the gate structure 24 and within an exposed second portion of the III-V compound semiconductor layer 22, and removing the III-V compound semiconductor material layer 22 and the insulator III-V compound semiconductor layer 20 from one end of the device to expose the topmost III-V compound semiconductor material fin portion 18 and a portion of insulating III-V compound material fin portion 16.

The source region 22S and the drain region 22D can be formed by introducing an n-type dopant or a p-type dopant into portions of the III-V compound semiconductor layer 22 not covered by the gate structure 24, and, if present, the dielectric spacer. The term "p-type" refers to the addition of impurities to an intrinsic semiconductor that creates deficiencies of valence electrons. "N-type" refers to the addition of impurities that contributes free electrons to an intrinsic semiconductor. The doping may be achieved utilizing ion implantation or gas phase doping. In embodiments in which the gate structure is a sacrificial gate structure, the sacrificial gate structure can now be replaced with a functional gate structure.

Prior to forming the source region 22S and the drain region 22D, a block mask (not shown) can be formed over a portion of the device in which the topmost III-V compound semiconductor material fin portion 18 and a portion of insulating III-V compound material fin portion 16 will be subsequently exposed. The block mask may include a hard mask material (such as, for example, silicon dioxide and/or silicon nitride), a photoresist, or a material stack of, from bottom to top, a hard mask material and a photoresist. The block mask can be formed by deposition of the block mask material, followed by lithography and, if needed, etching. After forming the source region 22S and the drain region 22D, the block mask can be removed from the device region not containing the newly formed source region 22S and drain region 22D by utilizing any well known material removal process.

Another block mask can be formed over the source region 22S, the gate structure 24 and drain region 22D, and then the III-V compound semiconductor layer 22 and the insulator III-V compound layer 20 are removed from the device to expose the topmost III-V compound semiconductor material fin portion 18 and a portion of insulating III-V compound material fin portion 16. The removal of the III-V compound semiconductor layer 22 and the insulator III-V compound layer 20 may comprise at least one etching process such as, for example, reactive ion etching. The another block mask can now be removed and metal contacts (not shown) can be formed as is conventional in the art. The metal contacts can be formed within an interlevel dielectric material. A set of metal contacts may contact the source region 22S and the drain region 22D, and optionally, the gate conductor portion. Another metal contact may contact a exposed portion of the second portion of the topmost III-V compound semiconductor material fin portion 18.

The exposed portion of the III-V compound semiconductor material fin portion 18 (i.e., the III-V compound semiconductor material core) represents a backgate of the device. The exposed portion of the III-V compound semiconductor material fin portion 18 can be biased to modify the threshold voltage of the functional gate structure (i.e., gate structure 24) which includes another portion of the topmost III-V compound semiconductor material fin portion 18. Thus, it is possible to bias the topmost III-V compound semiconductor material fin portion 18 such that each individual functional gate structure (i.e., gate structure 24) has multiple threshold voltages.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 a fin stack of, from bottom to top, a III-V compound semiconductor material fin portion, an insulating III-V compound material fin portion and a topmost III-V compound semiconductor material fin portion extending upwards from a surface of a bulk silicon substrate, wherein a dielectric material structure is present on each sidewall surface of said fin stack and each dielectric material structure has a topmost surface that is vertically offset and located at, or beneath, a bottommost surface of said topmost III-V compound semiconductor material fin portion;
 an insulating III-V compound layer straddling over a first portion of said topmost III-V compound semiconductor material fin portion;
 a III-V compound semiconductor layer on said insulating III-V compound layer; and
 a functional gate structure straddling over a portion of said III-V compound semiconductor layer, wherein a second portion of said topmost III-V compound semiconductor material fin portion is exposed.

2. The semiconductor structure of claim 1, wherein said III-V compound semiconductor material fin portion comprises a lower portion having a first defect density and an upper portion having a second defect density that is lower than the first defect density.

3. The semiconductor structure of claim 2, wherein defects within the lower portion of said III-V compound semiconductor material fin end at a sidewall surface of said dielectric material structure.

4. The semiconductor structure of claim 1, further comprising a source region in a first portion of said III-V compound semiconductor layer and on one side of said functional gate structure, and a drain region in a second portion of said III-V compound semiconductor layer and on another side of said functional gate structure.

5. The semiconductor structure of claim 1, wherein said insulating III-V compound layer directly contacts sidewall surfaces and a topmost surface of said first portion of said topmost III-V compound semiconductor material fin portion.

6. The semiconductor structure of claim 2, wherein said insulating III-V compound material fin portion and said insulating III-V compound layer comprise a III-V material having a second band gap and said III-V compound semiconductor material fin portion, said topmost III-V compound semiconductor material fin portion and said III-V compound semiconductor layer comprise a III-V compound semiconductor material having a first band gap, wherein said second band gap is greater than said first band gap.

7. The semiconductor structure of claim 6, wherein said insulating III-V compound material fin portion, said insulating III-V compound layer, said III-V compound semiconductor material fin portion, said topmost III-V compound semiconductor material fin portion and said III-V compound semiconductor layer have an epitaxial relationship and have said second defect density.

8. The semiconductor structure of claim 1, wherein a portion of said insulating III-V compound layer and a portion of said III-V compound semiconductor layer contact said topmost surface of each dielectric material structure.

9. The semiconductor structure of claim 1, wherein said second portion of said topmost III-V compound semiconductor material fin portion is a backgate.

10. The semiconductor structure of claim 1, wherein said bulk silicon substrate has a {100} crystal orientation.

11. A method of forming a semiconductor structure, said method comprising:
 providing a fin stack of, from bottom to top, a III-V compound semiconductor material fin portion, an insulating III-V compound material fin portion and a topmost III-V compound semiconductor material fin portion extending upwards from a surface of a bulk silicon substrate, wherein a dielectric material structure is present on each sidewall surface of said fin stack and each dielectric material structure has a topmost surface that is vertically offset and located at, or beneath, a bottommost surface of said topmost III-V compound semiconductor material fin portion;
 forming an insulating III-V compound layer straddling over said topmost III-V compound semiconductor material fin portion;
 forming a III-V compound semiconductor layer on said insulating III-V compound layer;
 forming a gate structure straddling over a portion of said III-V compound semiconductor layer; and
 exposing said topmost III-V compound semiconductor material fin portion at an end of said fin stack opposite an end containing said gate structure.

12. The method of claim 11, wherein said providing said fin stack comprises:
 forming a dielectric material layer on said surface of said bulk semiconductor substrate;
 providing a trench in said dielectric material layer;
 epitaxially growing a III-V compound semiconductor material fin within said trench;
 recessing an upper portion of said III-V compound semiconductor material fin to provide said III-V compound semiconductor material fin portion;
 epitaxially growing said insulating III-V compound material fin portion on a topmost surface of said III-V compound semiconductor material fin portion; and
 epitaxially growing said topmost III-V compound semiconductor material fin portion on a topmost surface of said insulating III-V compound material fin.

13. The method of claim 12, further comprising recessing remaining portions of said dielectric material layer to provide each dielectric material structure.

14. The method of claim 12, wherein said III-V compound semiconductor material fin comprises a lower portion having a first defect density and an upper portion having a second defect density that is less than said first defect density.

15. The method of claim 11, wherein said forming said insulating III-V compound layer comprises epitaxial growth.

16. The method of claim 11, wherein said forming said III-V compound semiconductor layer comprises epitaxial growth.

17. The method of claim 11, wherein said gate structure is a functional gate structure.

18. The method of claim 17, further comprising forming a source region in a first portion of said III-V compound semiconductor layer and on one side of said functional gate structure, and forming a drain region in a second portion of said III-V compound semiconductor layer and on another side of said functional gate structure.

19. The method of claim 11, wherein said gate structure is a sacrificial gate structure that is replaced with a functional gate structure after forming a source region in a first portion of said III-V compound semiconductor layer and on one side of said sacrificial gate structure, and forming a drain region in a second portion of said III-V compound semiconductor layer and on another side of said sacrificial gate structure.

20. The method of claim 11, wherein said exposing said topmost III-V compound semiconductor material fin portion comprises etching said III-V compound semiconductor layer and said insulating III-V compound layer.

* * * * *